United States Patent [19]

Tait

[11] 4,275,345
[45] Jun. 23, 1981

[54] A.C. IMPEDANCE MEASURING CIRCUIT WITH THERMALLY CONTROLLED RESISTIVE ELEMENT

[76] Inventor: David A. G. Tait, 34 Mount St., Dorking, Surrey, England

[21] Appl. No.: 953,862

[22] Filed: Oct. 23, 1978

[30] Foreign Application Priority Data

Nov. 9, 1977 [GB] United Kingdom ............... 46717/77

[51] Int. Cl.³ ......................... G05F 5/00; G01R 27/02
[52] U.S. Cl. ..................................... 323/363; 324/62; 324/DIG. 1
[58] Field of Search ............. 323/8, 66, 68, 69, 75 N, 323/75 H, 37, 40, 75 K; 324/DIG. 1, 62 R, 95

[56] References Cited

U.S. PATENT DOCUMENTS

| 2,375,497 | 5/1945 | Scully | 323/68 X |
|---|---|---|---|
| 2,906,957 | 9/1959 | Easter | 324/95 |
| 3,315,153 | 4/1967 | Whatley | 323/75 H |
| 3,597,676 | 8/1971 | Moore | 323/68 X |

FOREIGN PATENT DOCUMENTS

| 1210578 | 2/1966 | Fed. Rep. of Germany | 324/DIG. 1 |
|---|---|---|---|
| 1009724 | 6/1952 | France | 323/66 |
| 1143002 | 2/1969 | United Kingdom | 324/DIG. 1 |

Primary Examiner—William H. Beha, Jr.
Attorney, Agent, or Firm—Roylance, Abrams, Berdo & Farley

[57] ABSTRACT

An a.c. circuit including a thermistor used as a variable resistance device. A d.c. current source is provided for varying the temperature, and hence the resistance, of the thermistor and a DVM is provided for giving an indication of the resistance thereof and/or for controlling the temperature varying current source in order to set the resistance of the thermistor to a defined resistance. The thermistor can form part of an a.c. bridge and the temperature varying current source can be arranged to adjust the resistance of the thermistor until the bridge is balanced.

10 Claims, 5 Drawing Figures

A.C. IMPEDANCE MEASURING CIRCUIT WITH THERMALLY CONTROLLED RESISTIVE ELEMENT

BACKGROUND OF THE INVENTION

This invention concerns a.c. circuits including variable resistance devices.

In high frequency impedance measuring equipments there is considerable difficulty in producing a variable or switched resistance path which does not have errors caused by capacitance between switch contacts and inductance of the lengthy leads necessary to make the appropriate connections.

It is accordingly an object of the present invention to provide, in an a.c. circuit, a variable resistance path in which errors due to stray capacitance or inductance are reduced in relation to hitherto known arrangements.

SUMMARY OF THE INVENTION

The present invention provides an a.c. circuit including a variable resistance device comprising a thermally responsive variable resistance element, means for varying the temperature of said element, and means responsive to the resistance of said variable resistance element for giving an indication of the resistance thereof and/or for controlling the temperature varying means in order to set the said resistance means to a defined resistance.

By making use of a thermally responsive variable resistance element, e.g. a thermistor, in accordance with the invention, a variable resistance path may be provided without the requirement for switch contacts or other means tending to introduce errors into the resistance path.

The temperature varying means may comprise a source of electric current connected in series with said variable resistance element and means for varying the current supplied from said source to said element, which may be, for example, a directly-heated thermistor.

In one embodiment of the invention the said a.c. circuit may include means responsive to a parameter existing in the a.c. circuit, for controlling the temperature varying means in a sense such as to restore the a.c. circuit to a stable condition by corresponding variation of the resistance of said variable resistance element, and means is provided for measuring the resistance of said variable resistance element.

For example, the a.c. circuit may be an a.c. bridge, in which the said stable condition is the condition when the a.c. bridge is balanced, and the said variable resistance element is connected in common with said a.c. bridge, in one arm of the a.c. bridge, and with a d.c. current circuit to which is connected means isolated from said a.c. bridge and arranged to measure the resistance of said variable resistance element in terms of the d.c. current conducted thereby.

Alternatively, in order to enable the variable resistance element to be set to a defined resistance, the said variable resistance element may be included in a d.c. resistance bridge including calibrated variable resistance device, and the said resistance responsive means may be arranged to control the temperature varying means in a sense such as to restore the balance of the d.c. bridge and thus to set the resistance of the thermally responsive element to a value defined by the setting of said calibrated variable resistance device. In this case the said resistance responsive means and the said temperature varying means may be provided by a high gain d.c. amplifier of which the input is connected to receive the unbalance signal of the d.c. bridge and the output is connected to provide d.c. current to the bridge. The calibrated variable resistance device may, for example, be a conventional switchable resistance, the arrangement of the resistance bridge being such that in the balanced condition the resistance value of the current responsive element equals that of the switched resistance. The switchable resistance therefore serves to define the value of the resistance incorporated in the a.c. circuit, but since the switchable resistance is isolated from the a.c. circuit and subject only to the d.c. current flowing through the bridge, any stray capacitance or inductance thereof has no effect upon the operation of the a.c. circuit.

BRIEF DESCRIPTION OF THE DRAWINGS

The invention is illustrated by way of example in the accompanying drawings, in which.

DETAILED DESCRIPTION

Figure 1A:
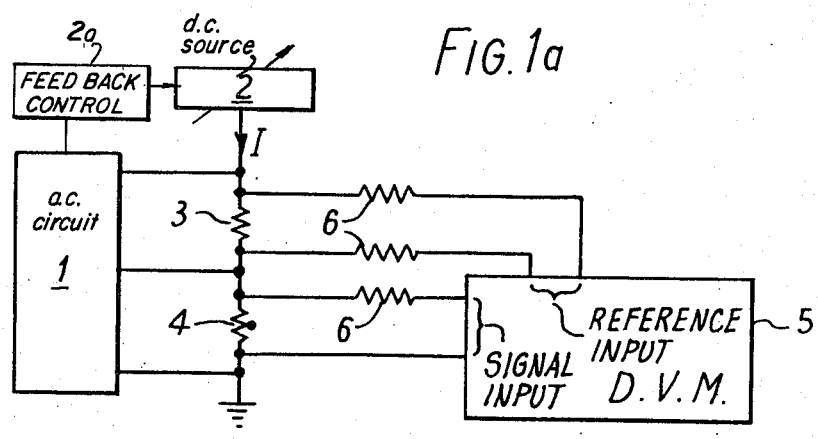
FIG. 1a is a circuit diagram illustrating one embodiment of the invention.

Referring to FIG. 1a, there is shown diagrammatically at 1, an a.c. circuit including resistance components provided by a standard resistor 3 having a resistance R, and a thermistor 4 the resistance value Th of which varies in accordance with the magnitude of the current conducted thereby. For ease of explanation, resister 3 and thermistor 4 are shown outside the block 1. The resistor 3 and thermistor 4 are also connected in series between a d.c. current source 2 and earth. A digital volt-meter, DVM, 5 is connected to measure the voltage drop across the resistor 3 and thermistor 4, the digital volt-meter 5 being decoupled from the a.c. circuit by means of high value resistors 6 inserted in the connecting leads. The digital volt-meter 5 is arranged to measure the ratio of the resistances R and Th, in known manner, and thus a measure of the resistance Th can be obtained. By variation of the d.c. current I supplied from the d.c. source 2 through the resistor 3 and thermistor 4, the resistance Th may be correspondingly varied. Such variation of the current may be effected manually, for example by means of a simple manually operable, variable resistance, the corresponding setting of the resistance Th being observed by reading the output from the digital volt-meter DVM. Alternatively, the current supplied from the source 2 may be varied automatically as a function of the operation of the a.c. circuit 1. For example, the circuit 1 may be an a.c. bridge in which the resistors 3 and 4 form two arms of the bridge and the other two arms comprise, for example, a standard reactance and an unknown reactance whose value is to be measured, in which case by means of a feedback control circuit 2a the current I is automatically adjusted to produce a balanced condition of the a.c. bridge, the resistance value of the thermistor Th required to produce the balanced condition being readable from the digital volt-meter DVM.

Figure 1B:
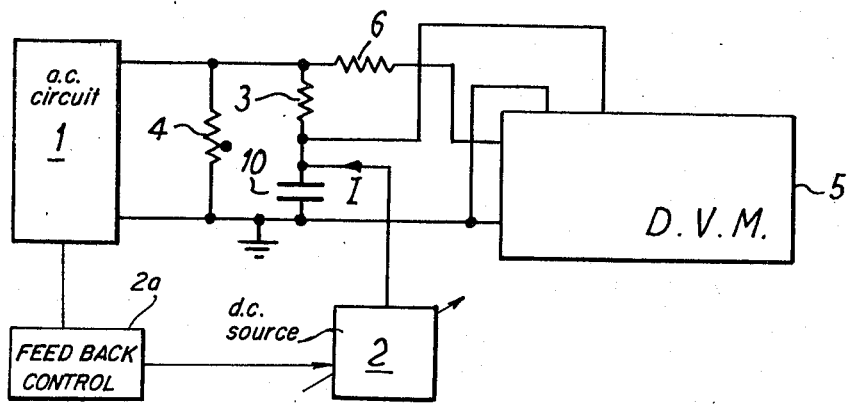
FIG. 1b is a circuit diagram illustrating a modification to the circuit of FIG. 1a, FIG. 1c is a circuit diagram illustrating a modification to the circuit of FIG. 1b.

FIG. 1b illustrates a modification of the circuit of FIG. 1a, which enables the current from the current source 2 to be applied to a point at ground potential for a.c. by reason of capacitor 10, and allows the use of a three-wire digital volt-meter 5. In this circuit, the digital volt-meter measures the ratio Th/(R+Th) and the a.c. resistance is R×Th/(R+Th), which equals the ratio reading from the digital volt-meter multiplied by the value of the resistance R. Thus, with an appropriate adjustment of the range of the digital volt-meter a direct reading of the resistance value of the thermistor 4 can be obtained.

Figure 1C:
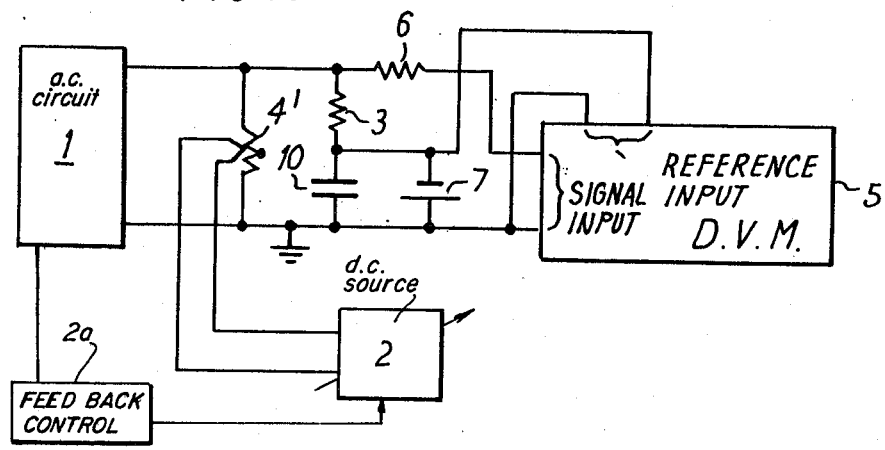

FIG. 1c illustrates a circuit similar to that of FIG. 1b in which an indirectly-heated thermistor 4' is substituted for the directly-heated thermistor 4. In addition, a source of a d.c. reference voltage 7 of about 1.5 volts is coupled effectively in the d.c. circuit including resistor 3 and thermistor 4' to provide a low value direct current through the thermistor 4' necessary for operation of the digital voltmeter 5.

Figure 2:
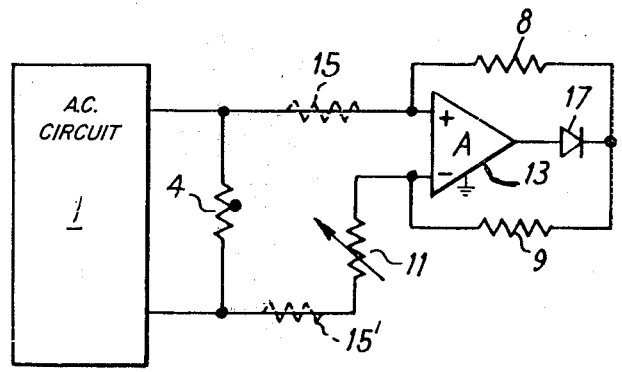
FIG. 2 is a circuit diagram of a further embodiment of the invention.

Referring to FIG. 2, there is shown an arrangement which enables the setting of the resistance value of the thermistor 4 to a defined value. In the circuit of FIG. 2, the four resistances R1, R2, Th and RV of resistors 8, 9, thermistor 4 and resistor 11 form the four arms of a d.c. resistance bridge which is supplied with d.c. current from the output of a high gain d.c. amplifier 13. The magnitude of the d.c. current is dependent upon the bridge unbalance signal applied at the input to the amplifier 13, and thus the circuit is driven towards a stable condition in which, with resistors 8 and 9 of equal value, the resistance Th of the thermistor 4 equals that of the variable resistance 11. A resistor 15 may be provided in order to provide decoupling of the a.c. circuit from the d.c. bridge, in which case a resistor 15' of equal value is required in series with the variable resistance 11 to maintain calibration. The variable resistance 11 may be a precision calibrated variable resistance and since this need only be suitable for use with d.c. current, any stray capacitance or inductance thereof may be ignored in relation to the operation of the a.c. circuit. A diode 17 prevents the thermistor 4 from being heated by a negative output from the amplifier 13, which would represent an unstable state of the circuit.

Figure 3:
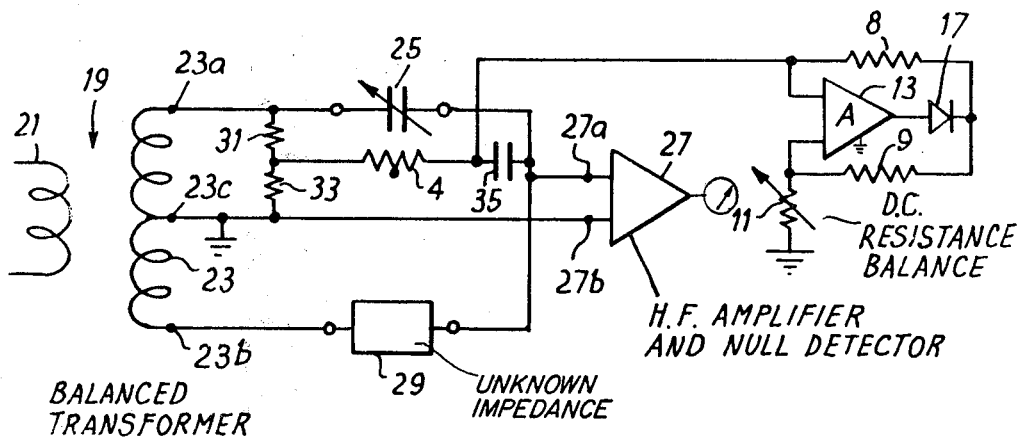
FIG. 3 is a circuit diagram of a further embodiment of the invention.

FIG. 3 shows the application of the principle illustrated in FIG. 2 to a specific a.c. circuit, in this case a balanced transformer bridge including a balanced transformer 19 having a primary winding 21 and a centre-tapped secondary winding 23.

One end 23a of the secondary winding 23 is coupled through a reference capacitor 25 to one input 27a of a high frequency amplifier and null detector 27. The other end 23b of the secondary winding 23 is coupled through an unknown impedance 29, whose reactance is to be determined, to the input 27a, and the centre tap 23c is coupled to earth and to the other input 27b of the null detector 27. Two resistors 31,33 having resistances R1 and R2 respectively, are connected in series across the taps 23a and 23c. The thermistor 4 has one end connected to the junction between the resistors 31 and 33 and the other end coupled through a capacitor 35 to the input 27a of the null detector 27. The reactance Zu of an unknown impedance 29 is balanced by adjustment of the reference capacitance 25, and the loss or resistance component is balanced by adjustment of the resistance of the thermistor 4, by manual adjustment of the variable resistance 11 as described above. The balanced condition of the bridge is indicated by a high frequency amplifier and null detector 27.

The effective a.c. resistance in shunt with reference capacitor 25 having a capacitance C is given by $$R_{eff} = [(R_1+R_2)/R_2] \times [[(R_1 \times R_2)/(R_1+R_2)] + Th]$$

The factor in double brackets is set by the adjustment of resistor 11. The ratio of $(R_1+R_2)/R_2$ can be chosen to give a suitable full scale value, and since it is a ratio rather than an absolute resistance value, these resistors can be chosen of such a value as to minimize a.c. errors, and can even be switched without appreciable error.

In addition to the circuits described, the invention is applicable to other a.c. circuits such as to the control of the resistance arm or arms of a R.C. oscillator.

I claim:

1. An a.c. impedance measuring circuit comprising a first, a.c. bridge circuit including a transformer having a primary winding and a tapped secondary winding wherein the two parts of the secondary winding form two arms of said bridge circuit, a variable resistance element in a third arm of said bridge circuit and having a resistance value which varies in dependence upon its temperature, a fourth arm of the bridge circuit being adapted to be coupled to a device having an impedance to be measured, and a second, d.c. circuit including a source of direct current coupled to said resistance element to provide a direct current to heat said resistance element, means for varying the magnitude of said direct current to control the temperature of said resistance element for setting its resistance value to the value required to balance the in-phase component of impedance of the device to be measured by the a.c. bridge circuit, and means responsive to said variable resistance element for giving an indication of the value to which said resistance element has been set, the direct current and the resistance responsive means having substantially no effect on the operation of the a.c. bridge circuit other than the setting of the resistance value of said element.

2. A circuit as claimed in claim 1, in which the variable resistance element is a thermistor.

3. A circuit as claimed in claim 1 or 2, wherein said temperature varying means comprises a source of electric current connected in series with said variable resistance element and means for varying the current supplied from said source to said element.

4. A circuit as claimed in claim 1 or 2, wherein said variable resistance element is an indirectly-heated device having heater terminals and said temperature varying means comprises a source of a direct current coupled in series with said heater terminals for heating the device.

5. A circuit according to 1 or 2, wherein said variable resistance element is an indirectly-heated device having heater terminals, said temperature varying means comprises a source of a direct current coupled in series with said heater terminals for heating the device and further comprising a source of a d.c. voltage coupled to said variable resistance element to provide a d.c. current through said variable resistance element to facilitate operation of said resistance responsive means.

6. A circuit as claimed in claim 1, including means responsive to an electrical parameter existing in the a.c. bridge circuit, for controlling the temperature varying means in a sense such to balance said bridge circuit by corresponding variation of the resistance of said variable resistance element, and said resistance responsive means comprises measuring means for measuring the resistance of said variable resistance element.

7. A circuit as claimed in claim 6, in which said variable resistance element is connected in common with said a.c. bridge and with said d.c. current circuit, and wherein the measuring means substantially isolated from said a.c. bridge is arranged to measure the resistance of said variable resistance element in terms of the d.c. current conducted thereby.

8. A circuit as claimed in claims 1, 6 or 7, in which said, d.c. circuit includes a d.c. resistance bridge, said variable resistance element is included in one arm of said d.c. resistance bridge and a calibrated variable resistance device is included in another arm of said d.c. bridge, and the said resistance responsive means is arranged to control the temperature varying means in a sense such as to restore the balance of the d.c. bridge and thus to set the resistance of the thermally responsive element to a value defined by the setting of said calibrated variable resistance device.

9. A circuit as claimed in claim 7, in which the said resistance responsive means and the said temperature varying means are provided by a high gain d.c. amplifier of which the input is connected to receive the unbalance signal of the d.c. bridge and the output is connected to provide d.c. current to the thermally responsive resistance element.

10. A circuit as claimed in claim 1, 6 or 7 in which said resistance responsive means comprises a digital volt-meter.

* * * * *